(12) United States Patent
Hakomori et al.

(10) Patent No.: US 7,903,984 B2
(45) Date of Patent: Mar. 8, 2011

(54) OPTICAL RECEIVER

(75) Inventors: Katsuhiko Hakomori, Kawasaki (JP);
Masakazu Horishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 606 days.

(21) Appl. No.: 12/031,841

(22) Filed: Feb. 15, 2008

(65) Prior Publication Data
US 2008/0199190 A1 Aug. 21, 2008

(30) Foreign Application Priority Data

Feb. 19, 2007 (JP) ................................ 2007-037432

(51) Int. Cl.
*H04B 10/00* (2006.01)

(52) U.S. Cl. ........................................ 398/208; 398/202

(58) Field of Classification Search ........... 398/202–214
See application file for complete search history.

(56) References Cited

U.S. PATENT DOCUMENTS

| | | | | |
|---|---|---|---|---|
| 4,561,091 | A * | 12/1985 | Scholl et al. .................. 370/445 |
| 6,636,348 | B2 * | 10/2003 | Noguchi .................. 359/341.44 |
| 6,785,477 | B1 * | 8/2004 | Masuda et al. ................ 398/208 |
| 7,031,621 | B2 * | 4/2006 | Nagakubo et al. ............ 398/208 |
| 7,039,329 | B2 * | 5/2006 | Kenny .......................... 398/202 |
| 7,218,865 | B2 * | 5/2007 | Doh et al. ..................... 398/202 |
| 7,751,725 | B2 * | 7/2010 | Tanaka .......................... 398/202 |
| 7,787,781 | B2 * | 8/2010 | Murayama .................... 398/210 |
| 2002/0075547 | A1 * | 6/2002 | Mashinsky .................... 359/195 |
| 2008/0199190 | A1 * | 8/2008 | Hakomori et al. ............ 398/202 |

FOREIGN PATENT DOCUMENTS

| | | |
|---|---|---|
| JP | 5-75543 | 3/1993 |
| JP | 9-284222 | 10/1997 |
| JP | 10-229365 | 8/1998 |

* cited by examiner

*Primary Examiner* — Agustin Bello
(74) *Attorney, Agent, or Firm* — Staas & Halsey LLP

(57) ABSTRACT

An optical receiver comprising: a photoelectric converting unit converting an input optical signal into an converted electrical signal; a splitting unit splitting the converted electrical signal into a plurality of split electrical signals; an amplifier amplifying one of the plurality of the split electrical signals with a first input time constant and thereby outputting an output signal; a detection circuit detecting an interruption of the input optical signal with a second input time constant on the basis of one of the plurality of the split electrical signals other than the one of the plurality of the split electrical signals input to the amplifier and thereby outputting a detection signal; and a delay circuit configured to delay the detection signal; wherein, the second input time constant of the detection circuit is smaller than the first input time constant of the amplifier.

16 Claims, 14 Drawing Sheets

PRIOR ART

PRIOR ART

OPTICAL RECEIVER

The present invention claims foreign priority to Japanese application 2007-037432, filed on Feb. 19, 2007, which is incorporated herein by reference in its entirety.

DESCRIPTION OF THE RELATED ART

In optical communication systems of the related art, optical signals in different formats, such as Ethernet® or synchronous optical network (SONET), have been transmitted using different systems. In contrast, there has been a demand in recent years for transmitters capable of maintaining transmission characteristics regardless of real-time changes in the format or the bit rate of optical signals in the system, the changes caused by switching with an optical switch or the like.

For example, there has been a demand for simultaneous and continuous transmission of a low-speed optical signal, at 125 Mbps (100BASE), for example, and a high-speed optical signal, at SONET 2.7 Gbps (forward error correction (FEC) OC48), for example, using one optical module. In order to change a line, in case of a line failure, for example, a transmitter includes a detection circuit for detecting an interruption of optical signal input.

FIG. 12 is a block diagram showing a configuration of an optical communication system of the related art. A transmission line 1210 is a two-way backbone transmission line in an optical communication system 1200. On the transmission line 1210, an optical signal is amplified by optical amplifiers 1220 as demanded. A demultiplexer 1230 provided on the transmission line 1210 demultiplexes the optical signal passing through the demultiplexer 1230 and outputs part of the optical signal to a wavelength selection switch 1240. The wavelength selection switch 1240 outputs the optical signal output from the demultiplexer 1230 to a receiver 1241 or a receiver 1242 according to wavelength.

A transmitter 1251 and a transmitter 1252 output optical signals with different wavelengths to a wavelength selection switch 1250. The wavelength selection switch 1250 performs wavelength division multiplexing of the optical signals output from the transmitter 1251 and the transmitter 1252 and outputs the multiplexed signal to a multiplexer 1260. The multiplexer 1260 multiplexes the optical signal passing through the transmission line 1210 and the optical signal output from the wavelength selection switch 1250.

FIG. 13 is a block diagram showing a structure of an optical receiver of the related art. As shown in FIG. 13, an optical receiver 1300 includes a photoelectric converter including a photoelectric conversion element 1310 and a preamplifier 1320, a main amplifier 1330, a detection circuit 1340, capacitors 1350, and resistors 1360. The optical receiver 1300 can be, for example, the receiver 1241 shown in FIG. 12. The photoelectric conversion element 1310 converts an optical signal output from the wavelength selection switch 1240 into an electrical signal and outputs the electrical signal to the preamplifier 1320.

The preamplifier 1320 amplifies the electrical signal output from the photoelectric conversion element 1310 and outputs amplified signals to the main amplifier 1330. The preamplifier 1320 includes an automatic gain control (AGC) circuit for automatically adjusting the amplitude of its output electrical signals to be constant. In this case, the preamplifier 1320 is a differential amplifier for outputting a pair of electrical signals as a differential signal including a non-inverted signal and an inverted signal.

The main amplifier 1330 amplifies the electrical signals output from the preamplifier 1320. On the basis of the electrical signals amplified by the main amplifier 1330, the detection circuit 1340 detects whether the input of the optical signal received by the optical receiver 1300 is interrupted. The capacitors 1350 and the resistors 1360 are provided between the preamplifier 1320 and the main amplifier 1330. The capacitors 1350 are coupling capacitors for cutting off direct current (DC) components of the electrical signals. The resistors 1360 are terminating resistors for achieving impedance matching.

The capacitors 1350 and the resistors 1360 included in the optical receiver 1300 constitute a time-constant circuit. The time constant τ of the time constant circuit is the product CR of the capacitance C of the capacitors 1350 and the resistance R of the resistors 1360. A low cut-off frequency, relating to low-frequency characteristics, of the main amplifier 1330 is approximately $1/(2\pi CR)$.

FIG. 14 illustrates the band characteristics of the optical receiver of the related art. Referring to FIG. 14, the frequency of an electrical signal amplified by the main amplifier 1330 is plotted in abscissa, and the electrical signal gain of the main amplifier 1330 is plotted in ordinate. A characteristic 1410 indicates the band characteristic of the main amplifier 1330 in the case where the low cut-off frequency is set to a lower frequency 1411 by increasing the capacitance of the capacitors 1350.

A characteristic 1420 indicates the band characteristic of the main amplifier 1330 in the case where the low cut-off frequency is set to a higher frequency 1421 by reducing the capacitance of the capacitors 1350. It has been experimentally proven that, in order to achieve a sufficient gain for an electrical signal at 125 Mbps, it is necessary to reduce the low cut-off frequency of the main amplifier 1330 to approximately 1.5 KHz or lower. Here, as indicated by the characteristic 1410, the low cut-off frequency is reduced to 1.5 KHz by increasing the capacitance of the capacitors 1350.

FIG. 15 illustrates an eye pattern of an optical signal received by the optical receiver of the related art. As shown in FIG. 15, an optical signal 1500 amplified by the optical amplifiers 1220 on the transmission line 1210 additionally includes amplified spontaneous emission (ASE) 1510 as noise. When the optical signal 1500 including the ASE 1510 is converted into an electrical signal, the electrical signal is deviates from a threshold for determining the value of the electrical signal, and a bit error rate (BER) is increased.

FIG. 16 is a block diagram showing a modification of the structure of the optical receiver of the related art. In FIG. 16, components similar to those shown in FIG. 13 are given the same reference numerals, and descriptions thereof are omitted.

In order to overcome the foregoing problem with the ASE 1510, as shown in FIG. 16, an offset circuit 1610 is provided in the optical receiver 1300 of the related art. The offset circuit 1610 compensates for the deviation of the electrical signals with respect to the threshold, which is caused by the ASE 1510, by applying DC offsets to the electrical signals output from the preamplifier 1320 to the main amplifier 1330.

SUMMARY

Described below is an optical receiver comprising: a photoelectric converting unit converting an input optical signal into an converted electrical signal; a splitting unit splitting the converted electrical signal into a plurality of split electrical signals; an amplifier amplifying one of the plurality of the split electrical signals with a first input time constant and thereby outputting an output signal; a detection circuit detecting an interruption of the input optical signal with a second input time constant on the basis of one of the plurality of the split electrical signals other than the one of the plurality of the split electrical signals input to the amplifier and thereby outputting a detection signal; and a delay circuit configured to delay the detection signal; wherein, the second input time constant of the detection circuit is smaller than the first input time constant of the amplifier.

The above-described optical receiver is an example. All embodiments are not limited to ones including all the feature in this example.

DESCRIPTION OF THE PREFERRED EMBODIMENTS

Figure 1:
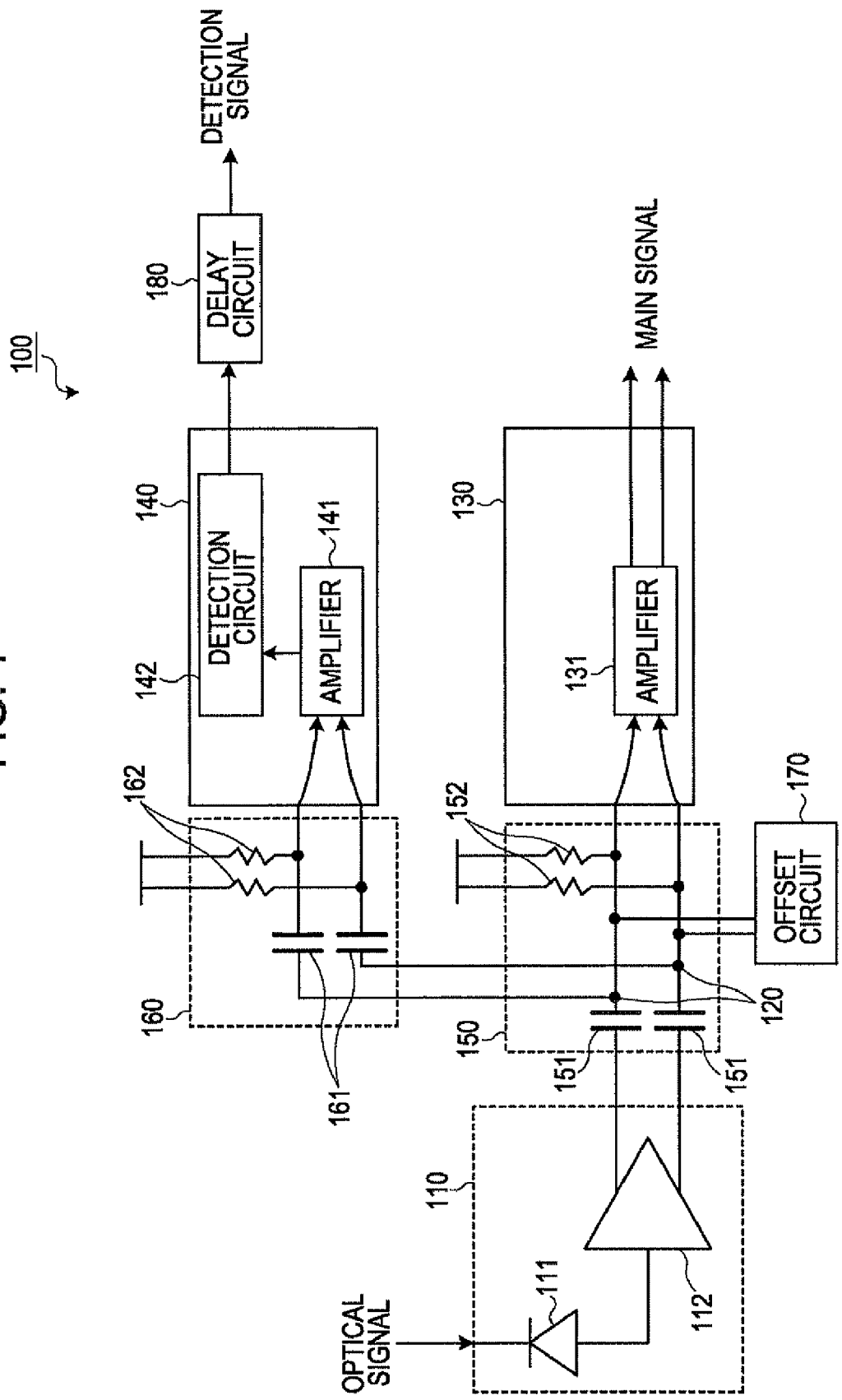
FIG. 1 is a block diagram showing the structure of an optical receiver according to an embodiment of the invention.

Reference will now be made in detail to embodiments of the present invention, examples of which are illustrated in the accompanying drawings, wherein like reference numerals refer to like elements throughout.

In the related art described above, the output signals of the preamplifier 1320 in the case of an interruption of optical signal input do not have a simple linear time constant. Rather, the output signals of the preamplifier 1320 may converge while transiently vibrating due to a feedback loop of the AGC circuit included in the preamplifier 1320.

When the capacitance of the capacitors 1350 is increased in order to ensure the low cut-off frequency, the time constant of the detection circuit 1340 is increased. Therefore, the detection circuit 1340 mistakes the transient vibration in the preamplifier 1320 for a signal, and a malfunction occurs in the detection circuit 1340.

Figure 17:
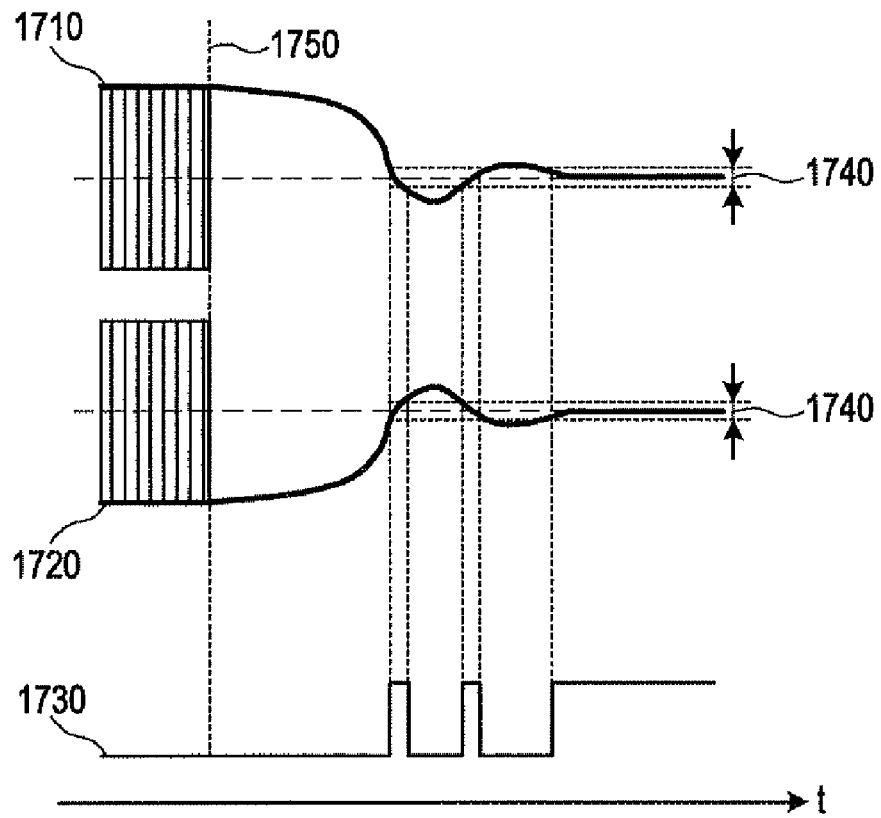
FIG. 17 illustrates output signals of a preamplifier in the case of an interruption in optical signal input.

FIG. 17 illustrates the output signals of the preamplifier in the case of an interruption of optical signal input. Referring to FIG. 17, time axis is plotted in abscissa.

1710 denotes a non-inverted signal output from the preamplifier 1320. 1720 denotes an inverted signal output from the preamplifier 1320. 1730 denotes a detection signal output from the detection circuit 1340 in the case of an interruption of optical signal input.

1740 denotes a threshold range for the detection circuit 1340 to detect an interruption of optical signal input.

In the case where the voltage level of the electrical signals output from the preamplifier 1320 is outside the threshold range 1740, the detection circuit 1340 determines that an optical signal has been input and sets the detection signal to low. In the case where the voltage level of the electrical signals output from the preamplifier 1320 is within the threshold range 1740, the detection circuit 1340 determines that the input of an optical signal has been interrupted and sets the detection signal 1730 to high.

1750 denotes a time at which an interruption of optical signal input has occurred. As indicated by 1750, when an interruption of optical signal input occurs, the non-inverted signal 1710 and the inverted signal 1720 start converging to be within the threshold range 1740, and, after the signals 1710 and 1720 are within the threshold range 1740, the signals 1710 and 1720 become outside the threshold range 1740 again. This transient vibration is repeated a few times. Therefore, the detection signal 1730 is switched between low and high every time the transient vibration is repeated, and this transient vibration is mistaken for a signal.

In order to change a line at a high speed in the case of an interruption of optical signal input due to a line failure or the like, for example, SONET defines that the interruption detection time from an interruption of optical signal input to detection of optical signal input interruption must range from 2.3 µs and 100 µs. SONET also defines the recovery detection time from recovery of optical signal input to detection of optical signal input recovery must range from 125 µs to 250 µs.

In the case where the capacitance of the capacitors 1350 is increased in order to ensure the low cut-off frequency, the time constant of the detection circuit 1340 is increased, and, as a result, the interruption detection time from an interruption of optical signal input to detection of optical signal input interruption is increased. For example, the low cut-off frequency for reliably receiving a low-speed signal at 125 Mbps or the like is approximately 1.5 kHz.

In this case, the time constant is 100 µs or greater, and this does not satisfy the condition concerning the interruption detection time defined in SONET. In the case where the capacitance of the capacitors 1350 is increased in order to ensure the low cut-off frequency, a malfunction occurs in the foregoing detection circuit 1340, thus further elongating the interruption detection time.

The foregoing problems may be overcome by reducing the capacitance of the capacitors 1350 to set the time constant to a small value (to increase the low cut-off frequency). However, in the case of a sequence of the same symbol in a low-speed optical signal, the amount of sag or a temporarily reduction in the supplied voltage level is increased. As a result, more symbol errors occur when demodulating the electrical signals and the BER is increased.

Figure 18:
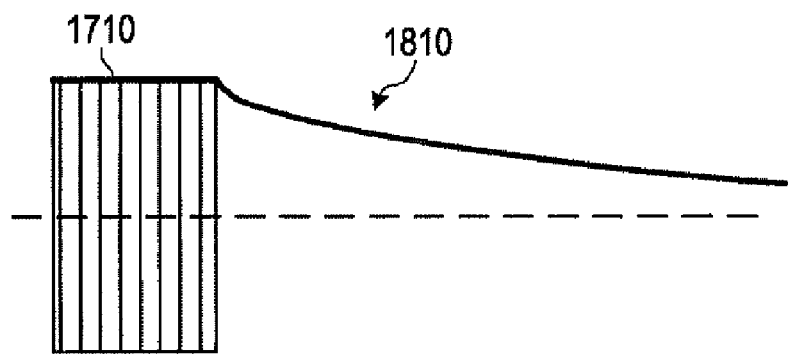
FIG. 18 illustrates an interruption detection time using a detection circuit (in the case where the capacitance of capacitors is large)
Figure 19:
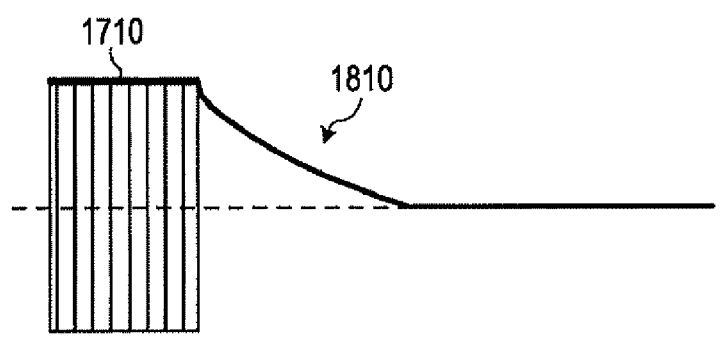
FIG. 19 illustrates an interruption detection time using the detection circuit (in the case where the capacitance of the capacitors is small)

FIG. 18 illustrates the interruption detection time in the case where the detection circuit is used (when the capacitance of the capacitors is large). FIG. 19 illustrates the interruption detection time in the case where the detection circuit is used (when the capacitance of the capacitors is small). In FIGS. 18 and 19, portions similar to those shown in FIG. 17 are given the same reference numerals, and descriptions thereof are omitted. 1810 denotes sag that occurs due to a sequence of the same symbol "1" in the optical signal.

In the case where the time constant is set to a large value by increasing the capacitance of the capacitors 1350, as shown in FIG. 18, the sag 1810 becomes smaller. Therefore, even in the case of a sequence of the same symbol, symbol errors are fewer. In contrast, in the case where the time constant is set to a small value by reducing the capacitance of the capacitors 1350, as shown in FIG. 19, the sag 1810 becomes larger. Therefore, in the case of a sequence of the same symbol, more symbol errors occur. In particular, if the low-speed optical signal includes ASE, still more symbol errors occur.

Figure 20:
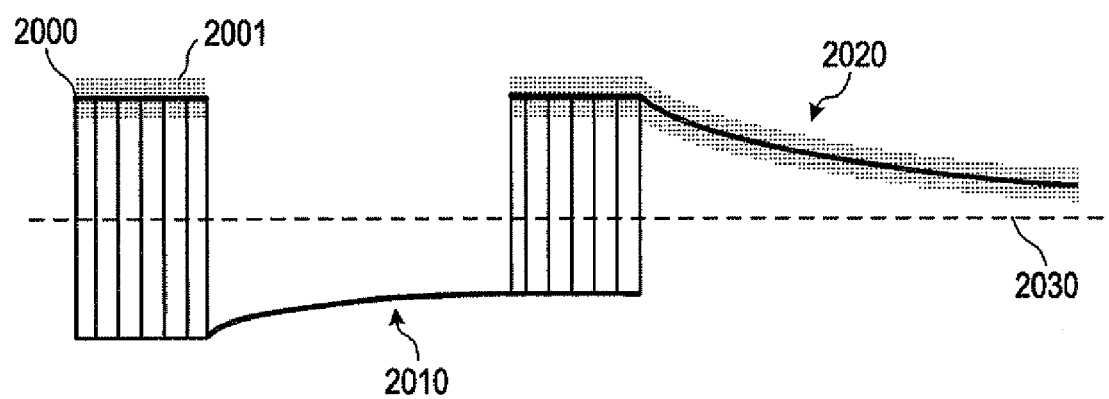
FIG. 20 is a waveform diagram showing sags in an electrical signal obtained by performing photoelectric conversion of an optical signal including ASE.

FIG. 20 is a waveform diagram showing sag in an electrical signal obtained by performing photoelectric conversion of an optical signal including ASE. 2000 denotes an electrical signal obtained by performing photoelectric conversion of an optical signal including ASE. 2001 denotes the ASE included in the optical signal. 2010 denotes sag that occurs due to a sequence of the symbol "0's" in the optical signal. 2020 denotes sag that occurs due to a sequence of the symbol "1's" in the optical signal. 2030 denotes a threshold for determining the symbol.

For example, when the sag 2020 occurs, the electrical signal 2000 becomes closer to the threshold 2030, and, as a result, the electrical signal 2000 may fall beyond the threshold 2030 even though the symbol is "1". Furthermore, when the electrical signal 2000 includes the ASE 2001, the electrical signal 2000 may fall beyond the threshold 2030 in a more frequent manner even though the symbol is "1". As a result, more symbol errors occur.

In the case where the offset circuit 1610 for applying DC offsets to the electrical signals output from the preamplifier 1320 to the main amplifier 1330 is provided in the optical receiver 1300, if the signal level of an optical signal received by the optical receiver 1300 is low, the DC offsets become an obstacle and a malfunction occurs in the detection circuit 1340.

Therefore, it is important for an optical receiver to maintain broad frequency characteristics and improve input-interruption detecting characteristics.

FIG. 1 is a block diagram showing the structure of an optical receiver according to an embodiment of the invention. As shown in FIG. 1, an optical receiver 100 according to the embodiment includes a trans-impedance amplifier (TIA) 110, a splitter 120, a reception unit 130, a detection unit 140, capacitors 151, resistors 152, capacitors 161, resistors 162, an offset circuit 170, and a delay circuit 180. The optical receiver 100 is an optical receiver for receiving optical signals transmitted using a plurality of communication formats or a plurality of bit rates.

The TIA 110 includes a photo detector (PD) 111 (photoelectric conversion element) and a preamplifier 112. The PD 111 is a photoelectric conversion element for converting an optical signal received from a network into an electrical signal. Here, it is assumed that the optical signal received from the network is a non-return-to-zero (NRZ) signal. The PD 111 outputs the electrical signal obtained to the preamplifier 112.

The preamplifier 112 converts the current value of the electrical signal output from the PD 111 into a voltage level. The preamplifier 112 outputs converted electrical signals to the splitter 120. Here, the preamplifier 112 is a differential amplifier for outputting a pair of electrical signals as a differential signal including a non-inverted signal and an inverted signal. The splitter 120 splits each of the electrical signals output from the TIA 110 into two portions. One portion is output as a main signal to the reception unit 130, and the other portion is output as a signal for detection to the detection unit 140.

The reception unit 130 includes a main amplifier 131. The main amplifier 131 amplifies the electrical signals output as the main signals from the splitter 120 as demanded. The reception unit 130 outputs the amplified electrical signals to an external device. The reception unit 130 may include a demodulation circuit for demodulating the electrical signals amplified by the main amplifier 131.

The detection unit 140 includes an amplifier 141 and a detection circuit 142. The amplifier 141 amplifies the electrical signals output as the signals for detection from the splitter 120 as demanded and outputs an amplified electrical signal to the detection circuit 142. On the basis of the electrical signal output from the amplifier 141, the detection circuit 142 detects whether the input of the optical signal received at the TIA 110 is interrupted. The detection circuit 142 further detects recovery from an input-interrupted state in which the input of the optical signal received at the TIA 110 has been interrupted. The detection circuit 142 outputs a detection signal indicating the detection result to the delay circuit 180.

The capacitors 151 are provided between the TIA 110 and the reception unit 130. The capacitors 151 are coupling capacitors for cutting off DC components of the electrical signals output from the TIA 110 to the reception unit 130. Here, the capacitors 151 are provided between the TIA 110 and the splitter 120. The capacitors 151 are provided on two signal paths for the non-inverted signal and the inverted signal.

The resistors 152 are provided between the TIA 110 and the reception unit 130. The resistors 152 are terminating resistors for achieving impedance matching and for preventing the electrical signals output from the TIA 110 to the reception unit 130 from being reflected. The resistance of the resistors 152 is a resistance according to the impedance of the paths. Here, the resistors 152 are provided between the splitter 120 and the reception unit 130. The resistors 152 are provided on the two signal paths for the non-inverted signal and the inverted signal.

The capacitors 151 and the resistors 152 constitute a time-constant circuit 150 (first time-constant circuit). The time-constant circuit 150 is set to a time constant with which the reception unit 130 can achieve a sufficiently low cut-off frequency. For example, in the case where the minimum bit rate of an optical signal received by the optical receiver 100 is 125 Mbps, the time-constant circuit 150 is set to a time constant with which the low cut-off frequency of the reception unit 130 is 1.5 kHz or lower.

The capacitors 161 are provided between the splitter 120 and the detection unit 140. The capacitors 161 are coupling capacitors for cutting off DC components of the electrical signals output from the splitter 120 to the detection unit 140. The capacitors 161 are provided on two signal paths for the non-inverted signal and the inverted signal.

The resistors 162 are provided between the splitter 120 and the detection unit 140. The resistors 162 are terminating resistor for achieving impedance matching and for preventing the electrical signals output from the splitter 120 to the detection unit 140 from being reflected. The resistance of the resistors 162 is a resistance according to the impedance of the paths. Here, the resistors 162 are provided between the capacitors 161 and the detection unit 140. The resistors 162 are provided on the two signal paths for the non-inverted signal and the inverted signal.

The capacitors 161 and the resistors 162 constitute a time-constant circuit 160 (second time-constant circuit). The time-constant circuit 160, which is disposed prior to the detection unit 140, is set to a time constant that is smaller than that of the time-constant circuit 150 disposed prior to the reception unit 130. For example, the resistors 152 of the time-constant circuit 150 and the resistors 162 of the time-constant circuit 160 have the same resistance, and the capacitance of the capacitors 151 of the time-constant circuit 150 is larger than that of the capacitors 161 of the time-constant circuit 160.

The offset circuit 170 is disposed prior to the reception unit 130. Here, the offset circuit 170 is provided between the splitter 120 and the resistors 152. The offset circuit 170 applies DC offsets according to ASE included in the optical signal received by the optical receiver 100 to the electrical signals output to the reception unit 130. The delay circuit 180 delays the detection signal output from the detection unit 140 as demanded.

Figure 2:
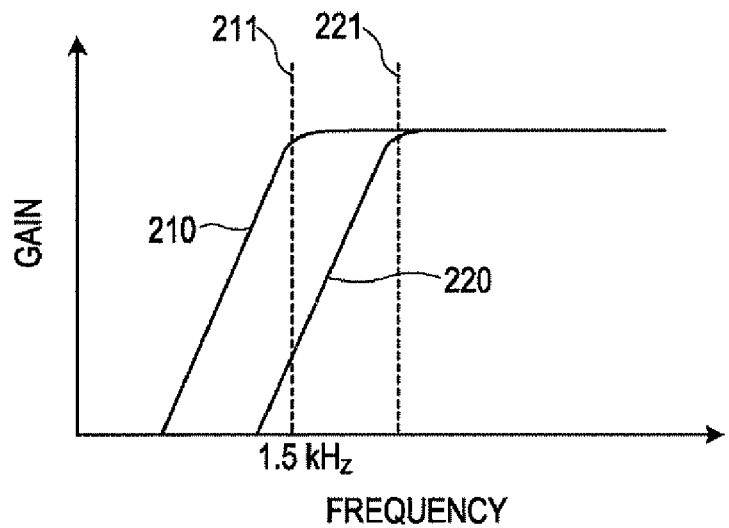
FIG. 2 illustrates low-frequency characteristics of the optical receiver according to an embodiment.

FIG. 2 illustrates low-frequency characteristics of the optical receiver according to the embodiment. Referring to FIG. 2, the frequency of an electrical signal is plotted in abscissa, and the electrical signal gain of the main amplifier 131 and the amplifier 141 is plotted in ordinate. A characteristic 210 indicates a low-frequency characteristic of the main amplifier 131. A characteristic 220 indicates a low-frequency characteristic of the amplifier 141.

Since the time constant of the time-constant circuit 150 is set to a value larger than that of the time-constant circuit 160, a low cut-off frequency 211 of the main amplifier 131 is lower than a low cut-off frequency 221 of the amplifier 141. In this case, the low cut-off frequency 211 of the main amplifier 131 is 1.5 kHz. Therefore, the main amplifier 131 can achieve a sufficient gain for a low-speed electrical signal at, for example, 125 Mbps.

Figure 3:
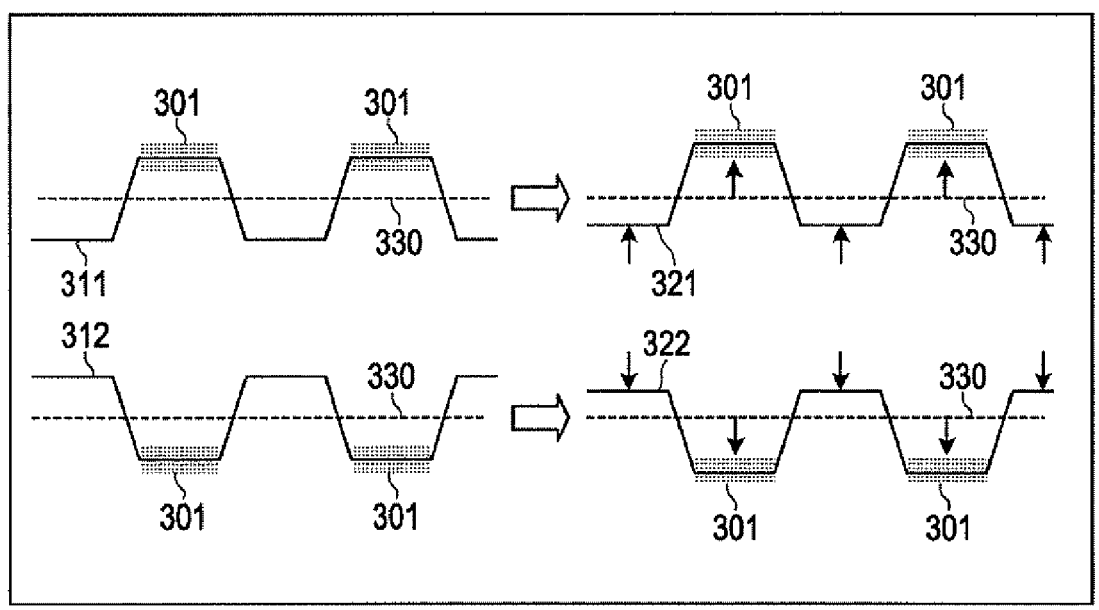
FIG. 3 illustrates application of DC offsets using the optical receiver according to an embodiment.

FIG. 3 illustrates application of DC offsets using the optical receiver according to the embodiment. Referring to FIG. 3, 311 denotes a non-inverted signal output from the TIA 110 to the reception unit 130. 312 denotes an inverted signal output from the TIA 110 to the reception unit 130. 321 denotes the non-inverted signal to which a DC offset is applied from the offset circuit 170.

322 denotes the inverted signal to which a DC offset is applied from the offset circuit 170. 301 denotes ASE included in each signal. The offset circuit 170 applies DC offsets according to ASE included in the optical signal received by the optical receiver 100 to the non-inverted signal 311 and the inverted signal 312.

More specifically, the offset circuit 170 applies a positive DC offset to the non-inverted signal 311 and a negative DC offset to the inverted signal 312. This compensates for deviation of the non-inverted signal 311 and the inverted signal 312 with respect to a threshold 330, which has been caused by the ASE 301. Accordingly, the BER when demodulating the electrical signals amplified by the main amplifier 131 can be optimized.

The offset circuit 170 and the detection unit 140 are separated from each other with the capacitors 161 provided therebetween. Accordingly, the detection circuit 142 of the detection unit 140 is not affected by DC offsets output from the offset circuit 170. Therefore, the detection circuit 142 can operate in a stable manner even in the case where the signal level of an optical signal received by the optical receiver 100 is low.

Figure 4:
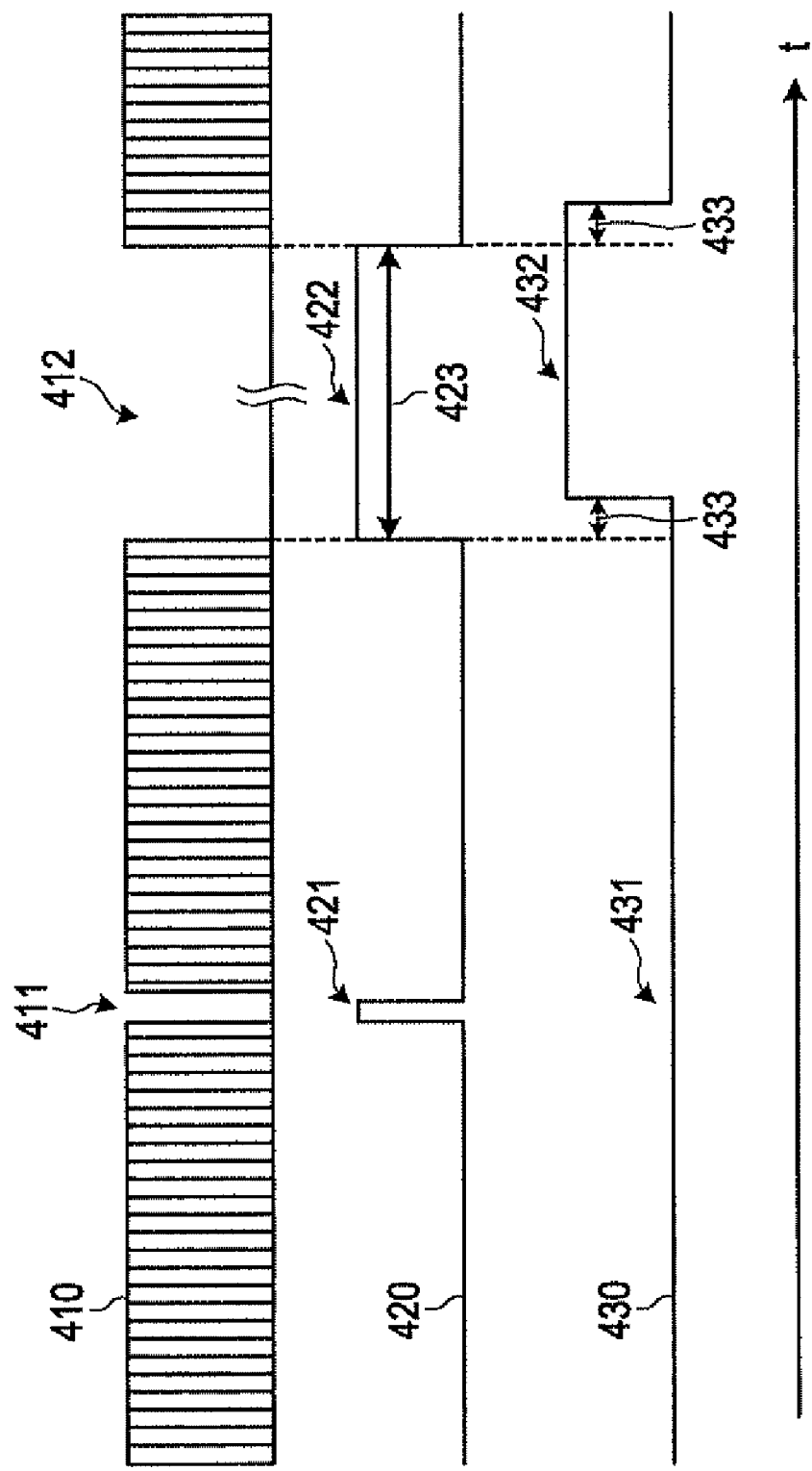
FIG. 4 is a waveform diagram showing an electrical signal in the optical receiver according to an embodiment.

FIG. 4 is a waveform diagram showing an electrical signal in the optical receiver according to the embodiment. Referring to FIG. 4, time axis is plotted in abscissa. An electrical signal 410 is an electrical signal output from the splitter 120 to the detection unit 140. An electrical signal 420 is an electrical signal output from the detection unit 140 to the delay circuit 180. An electrical signal 430 is an electrical signal delayed by the delay circuit 180.

411 denotes an instantaneous interruption of the electrical signal 410, which is caused by switching with a switch or the like. The detection circuit 142 responds to the instantaneous interruption of the electrical signal 410, and the electrical signal 420 instantaneously becomes high, which is indicated by 421. In contrast, the electrical signal 430, which is delayed by the delay circuit 180, does not respond to the instantaneous interruption of the electrical signal 410, which is indicated by 431, and remains low.

412 denotes an interruption, which is not instantaneous, of input of the electrical signal 410, which has been caused by an interruption of input of an optical signal received by the optical receiver 100. In this case, the detection circuit 142 responds to the interruption of input of the electrical signal 410, and the electrical signal 420 becomes high, which is indicated by 422, for duration 423 of the interruption of input of the electrical signal 410. In contrast, the electrical signal 430, which is delayed by the delay circuit 180, becomes high with a delay of a period 433 and remains high for the duration of the interruption of input of the electrical signal 410, which is indicated by 432.

Accordingly, a malfunction in the detection circuit 142 caused by switching using a switch or the like is prevented from occurring. Furthermore, a condition requiring that the interruption detection time from an interruption of optical signal input to detection of optical signal input interruption must be 2.3 μs or greater and a condition requiring that the recovery detection time from recovery of optical signal input to detection of optical signal input recovery must be 125 μs or greater, which are defined in SONET, can be satisfied.

According to the optical receiver 100 of the embodiment, as has been described above, each of the electrical signals is split by the splitter 120, whereby the sufficiently low cut-off frequency of the main amplifier 131 can be ensured, and the time constant of the detection circuit 142 can be set to a small value. By ensuring the sufficiently low cut-off frequency of the main amplifier 131, the BER is not increased even in the case of changes in the format or the bit rate of optical signals.

By setting the time constant of the detection circuit 142 to a small value, a malfunction in the detection circuit 142 is prevented from occurring. Furthermore, the interruption detection time from an interruption of optical signal input to detection of optical signal input interruption can be reduced by setting the time constant of the detection circuit 142 to a small value. Therefore, according to the optical receiver 100 of the embodiment, while broad frequency characteristics are maintained, input-interruption detecting characteristics can be improved.

According to the optical receiver 100 of the embodiment, each of the electrical signals is split by the splitter 120, and the offset circuit 170 and the detection unit 140 are separated from each other with the capacitors 161 provided therebetween. Accordingly, the detection circuit 142 of the detection unit 140 is not affected by DC offsets output from the offset circuit 170. Therefore, the detection circuit 142 can operate in a stable manner even in the case where the signal level of an optical signal received by the optical receiver 100 is low.

According to the optical receiver 100 of the embodiment, the detection signal output from the detection unit 140 can be delayed by the delay circuit 180 as demanded. Therefore, according to the optical receiver 100 of the embodiment, a malfunction in the detection circuit 142 caused by switching using a switch or the like can be prevented from occurring.

Figure 5:
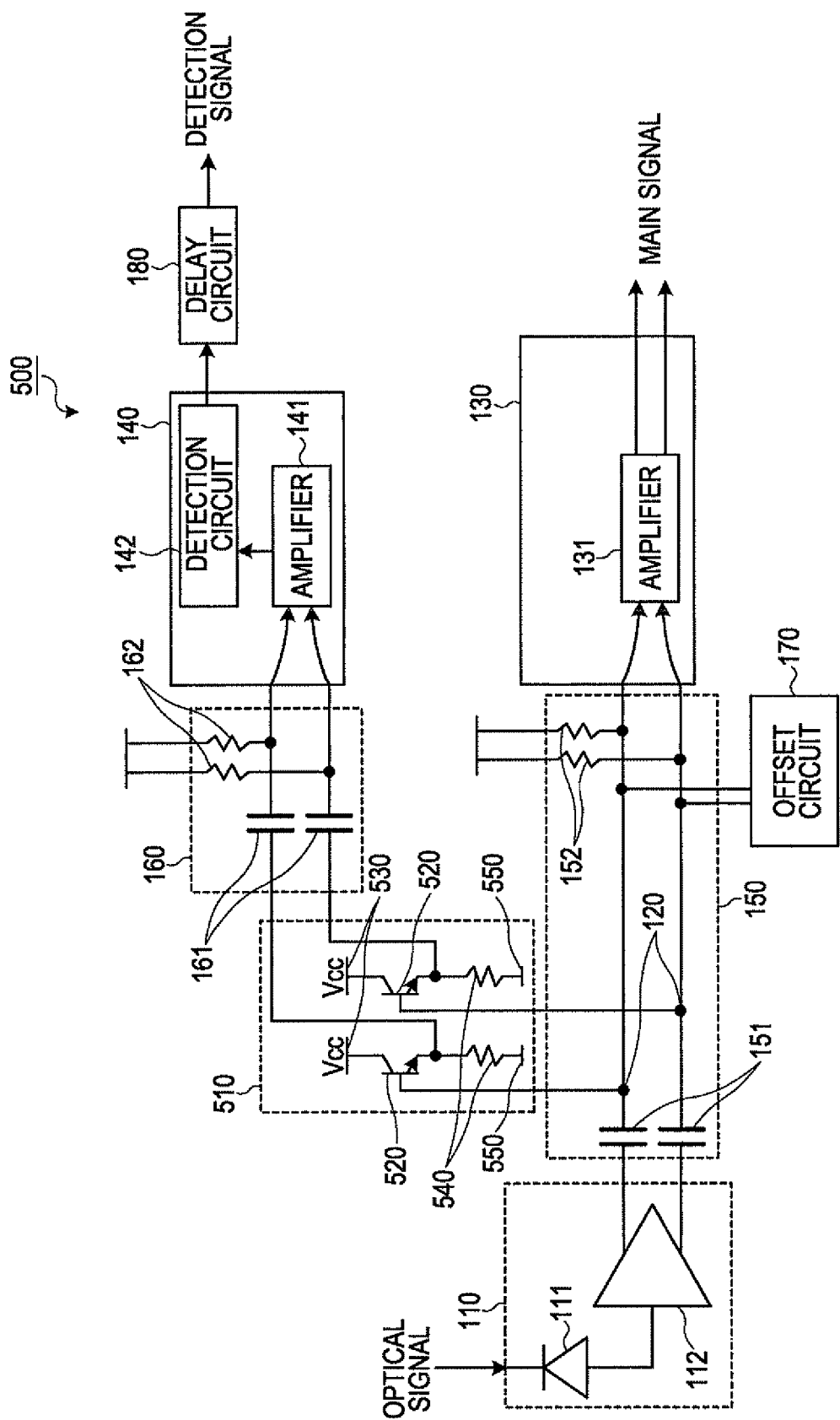
FIG. 5 is a block diagram showing the structure of an optical receiver according to an embodiment of the invention.

FIG. 5 is a block diagram showing the structure of an optical receiver according to an embodiment. In FIG. 5, components similar to those shown in FIG. 1 are given the same reference numerals, and descriptions thereof are omitted. As shown in FIG. 5, an optical receiver 500 according to an embodiment additionally includes, besides the components of the optical receiver 100 according to the embodiment, a buffer amplifier 510, which is disposed prior to the detection unit 140. Here, the buffer amplifier 510 is provided between the splitter 120 and the time-constant circuit 160.

The buffer amplifier 510 includes emitter-follower circuits. The buffer amplifier 510 includes NPN transistors 520, power supplies 530, resistors 540, and grounds 550. Each of electrical signals output from the splitter 120 is input to the base of a corresponding one of the transistors 520. The collector of each of the transistors 520 is connected to a corresponding one of the grounds (Vcc) 530. The emitter of each of the transistors 520 is connected to a corresponding one of the resistors 540.

Each of the resistors 540 is connected to a corresponding one of the grounds 550. An electrical signal input to the base of each of the transistors 520 is output from the emitter of the transistor 520 to the detection unit 140. The emitter-follower circuits are provided on two signal paths for the non-inverted signal and the inverted signal. Emitter-follower circuits have high input impedance and low output impedance. Furthermore, emitter-follower circuits have a large current value gain.

Therefore, the buffer amplifier 510 has a buffer amplifying function of allowing amplification and passage of electrical signals from the reception unit 130 to the detection unit 140 and cutting off electrical signals from the detection unit 140 to the reception unit 130. Accordingly, the operation of the time-constant circuit 160 or the detection unit 140 is prevented from affecting the operation of the time-constant circuit 150 or the reception unit 130.

Figure 6:
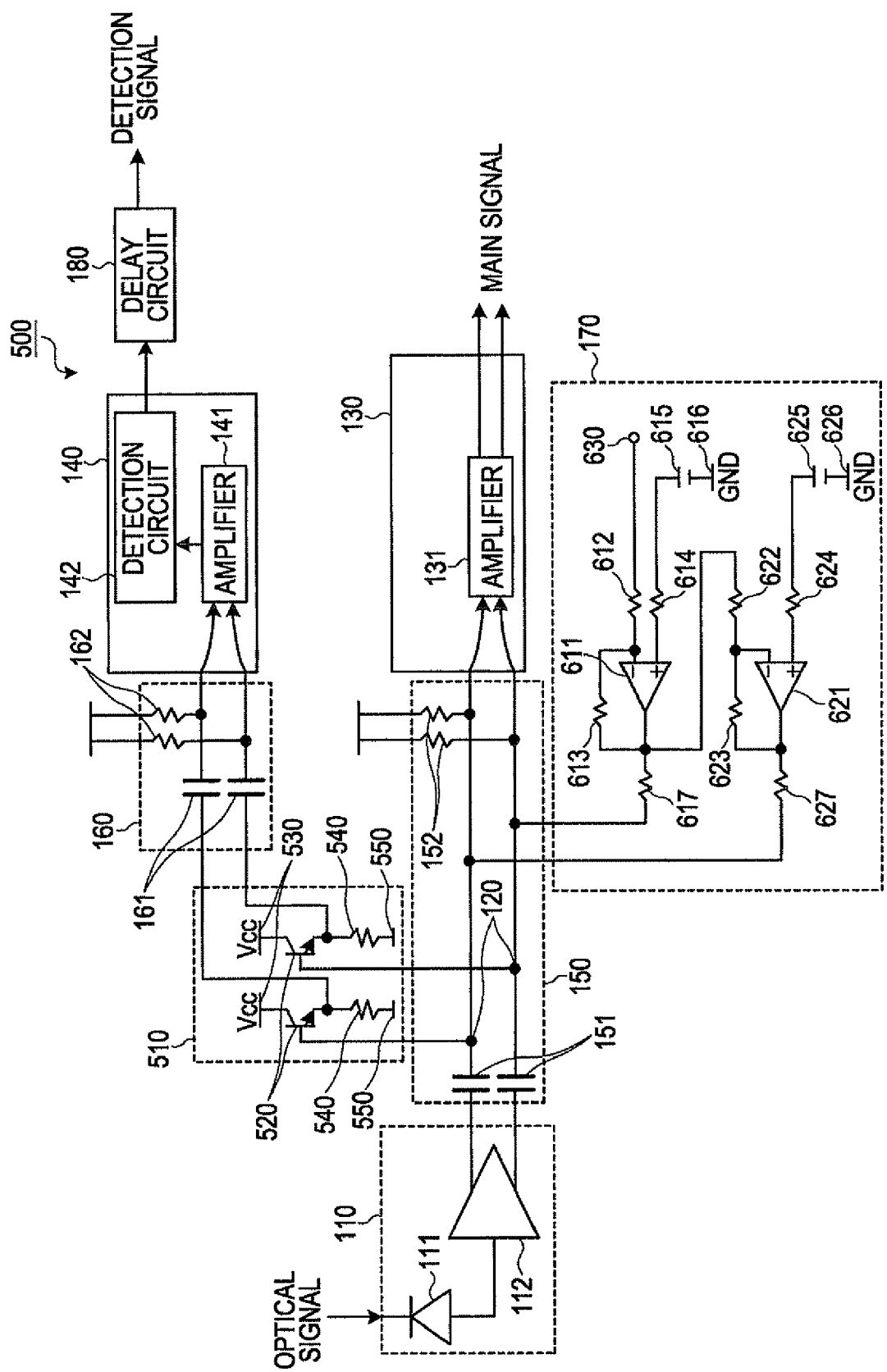
FIG. 6 is a block diagram showing a specific example of the structure of an offset circuit included in the optical receiver according to an embodiment.

FIG. 6 is a block diagram showing a specific example of the structure of the offset circuit of the optical receiver according to an embodiment. In FIG. 6, components similar to those shown in FIG. 5 are given the same reference numerals, and descriptions thereof are omitted. As shown in FIG. 6, the foregoing offset circuit 170 includes an operational amplifier 611, resistors 612 to 614, a power supply 615, a ground 616, a resistor 617, an operational amplifier 621, resistors 622 to 624, a power supply 625, a ground 626, a resistor 627, and a voltage regulator 630.

The resistor 612 is connected to an inverting input of the operational amplifier 611. The resistor 613 is connected between the inverting input and an output of the operational amplifier 611. The resistor 614 is connected to a non-inverting input of the operational amplifier 611. The resistor 614 is connected to the power supply (reference voltage level) 615. The power supply 615 is connected to the ground 616. The output of the operational amplifier 611 is connected to the resistor 617. The resistor 617 is connected between the splitter 120 and the reception unit 130 (on the path for the inverted signal). The resistor 612 is connected to the voltage regulator 630.

The resistor 622 is connected to an inverting input of the operational amplifier 621. The resistor 623 is connected between the inverting input and an output of the operational amplifier 621. The resistor 624 is connected to a non-inverting input of the operational amplifier 621. The resistor 624 is connected to the power supply (reference voltage level) 625. The power supply 625 is connected to the ground 626. The output of the operational amplifier 621 is connected to the resistor 627. The resistor 627 is connected between the splitter 120 and the reception unit 130 (on the path for the non-inverted signal). The resistor 622 is connected to the output of the operational amplifier 611.

Figure 7:
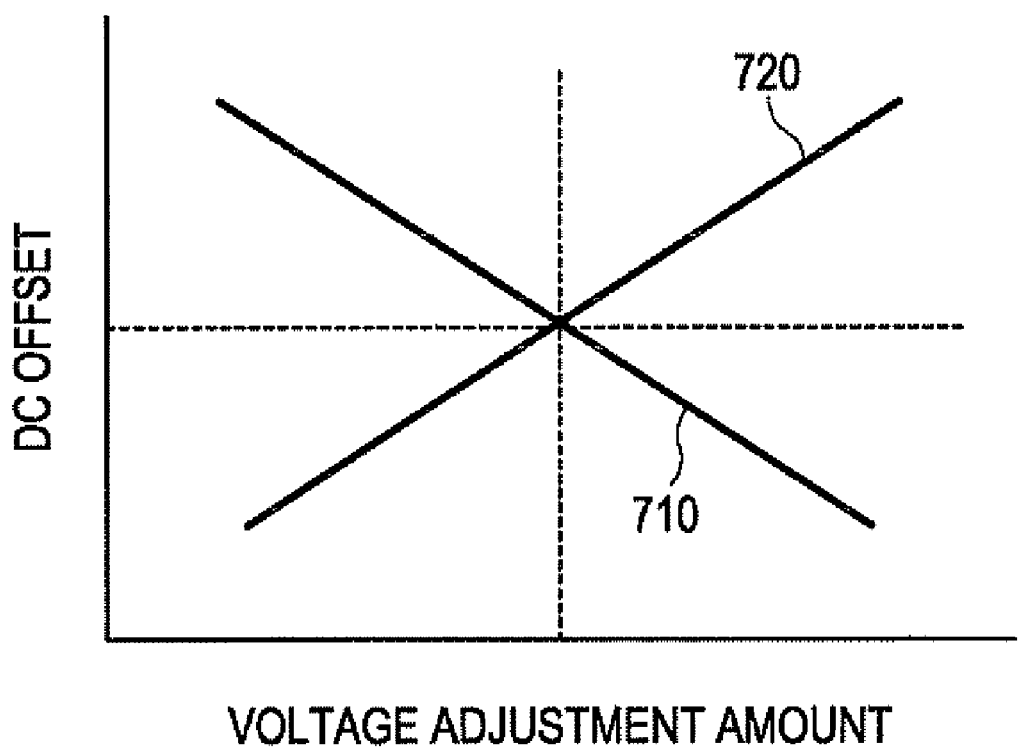
FIG. 7 illustrates characteristics of DC offsets output from the offset circuit.

FIG. 7 illustrates characteristics of DC offsets output from the offset circuit. Referring to FIG. 7, the amount of voltage level adjusted by the voltage regulator 630 of the offset circuit 170 is plotted in abscissa, and the voltage levels of DC offsets output from the offset circuit 170 are plotted in ordinate. A characteristic 710 is a characteristic of a DC offset output from the operational amplifier 611. A characteristic 720 is a characteristic of a DC offset output from the operational amplifier 621.

As shown in FIG. 7, when the voltage regulator 630 charges, both of the operational amplifier 611 and the operational amplifier 621 output DC offsets of opposite polarity. When the voltage level of the voltage regulator 630 changes, the voltage levels of the DC offsets of the operational amplifier 611 and the operational amplifier 621 also change.

Thus, changing the voltage level of the voltage regulator 630 can compensate for deviation of the non-inverted signal and the inverted signal with respect to the threshold, which has been caused by ASE included in the optical signal received by the optical receiver 500. Accordingly, the BER when demodulating the electrical signals amplified by the main amplifier 131 can be optimized. The structure of the offset circuit 170 described above is applicable to the optical receiver 100 according to the embodiment.

Figure 8:
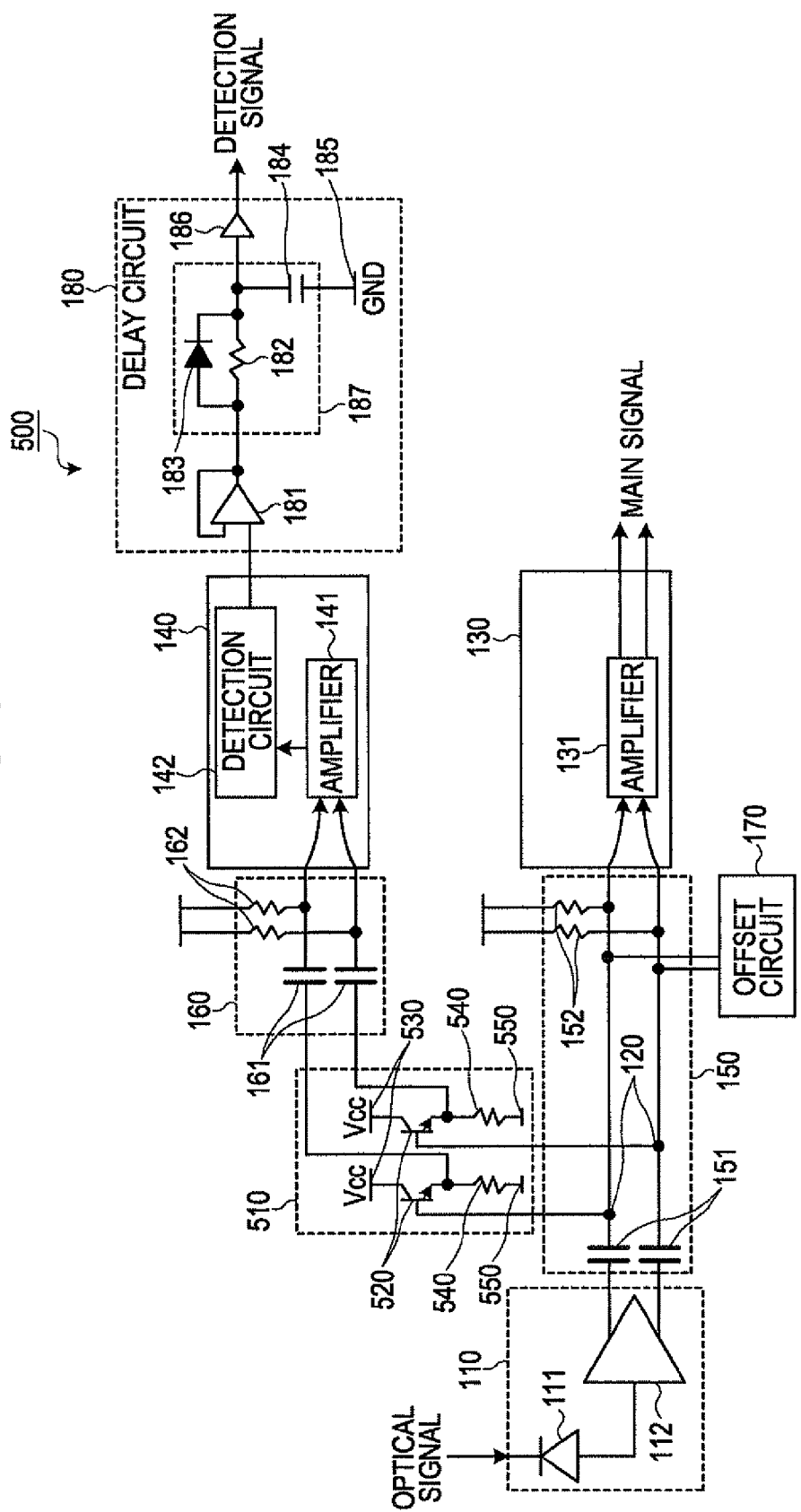
FIG. 8 is a block diagram showing a specific example of the structure of a delay circuit included in the optical receiver according to an embodiment.

FIG. 8 is a block diagram showing a specific example of the structure of the delay circuit of the optical receiver according to an embodiment. In FIG. 8, components similar to those shown in FIG. 5 are given the same reference numerals, and descriptions thereof are omitted. As shown in FIG. 8, the delay circuit 180 includes an operational amplifier 181, a resistor 182, a diode 183, a capacitor 184, a ground 185, and a buffer 186. The operational amplifier 181 has two inputs. A detection signal output from the detection unit 140 is input to one input.

An output of the operational amplifier 181 is connected to the other input of the operational amplifier 181 and to the resistor 182. The operational amplifier 181 has a buffer function. The diode 183 is connected in parallel to the resistor 182. The resistor 182 is connected to the buffer 186 and the capacitor 184. The capacitor 184 is connected to the ground 185. The capacitor 184 and one of the resistor 182 and the diode 183 constitute a 187.

Figure 9:
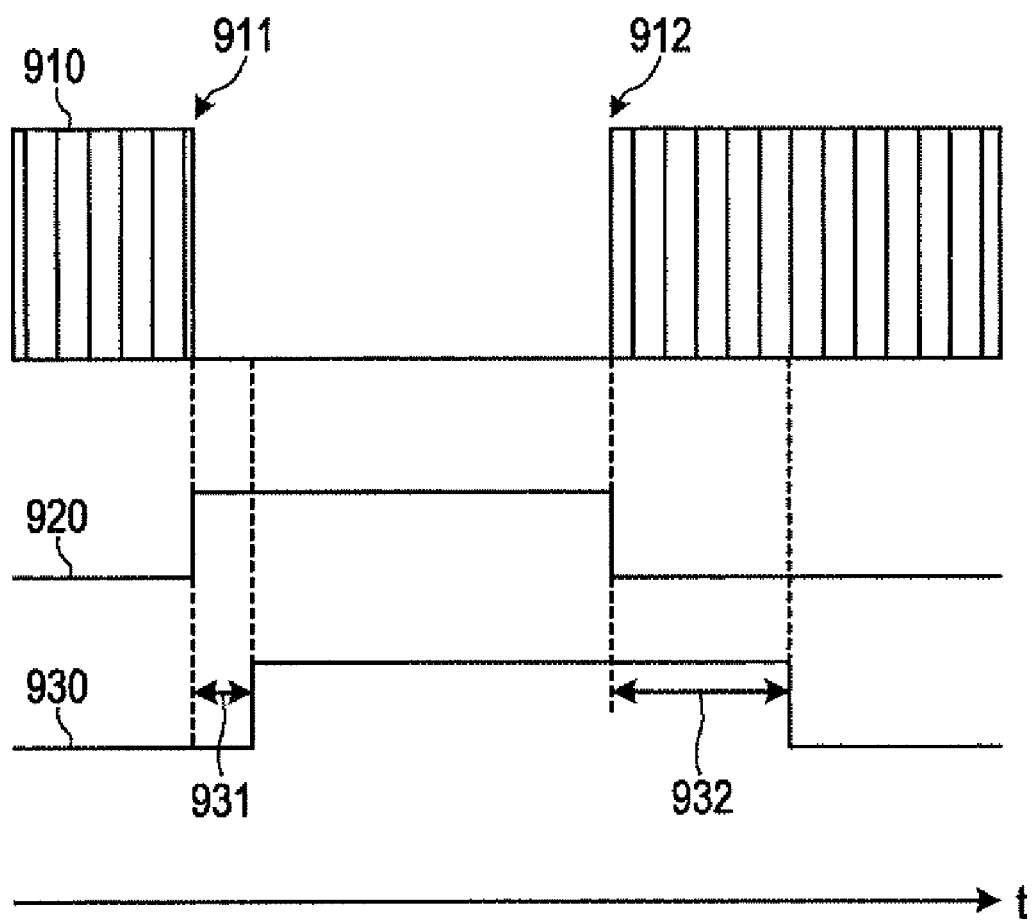
FIG. 9 is a waveform diagram showing a detection signal delayed by the delay circuit.

FIG. 9 is a waveform diagram showing a detection signal delayed by the delay circuit. Referring to FIG. 9, time axis is plotted in abscissa. 910 denotes an optical signal received by the optical receiver 500. 920 denotes a detection signal output from the detection unit 140. 930 denotes a detection signal delayed by the delay circuit 180. 911 denotes an interruption of input of the optical signal received by the optical receiver 500. 912 denotes recovery from the state in which the input of the optical signal received by the optical receiver 500 has been interrupted.

When the input optical signal is interrupted, the detection signal 920 changes from low to high. At this point, the effect of the resistor 182 disappears, and a forward electric current flows through the diode 183, which reduces the time constant of the time-constant circuit 187. Therefore, the detection signal 930 is delayed by a relatively small amount 931 in the case where an interruption of optical signal input occurs.

When the input optical signal recovers from the interruption, the detection signal 920 changes from high to low. At this point, a reverse electric current flows through the diode 183, which increases the time constant of the time-constant circuit 187. Therefore, the detection signal 930 is delayed by a relatively large amount 932 in the case where the optical signal recovers from the interruption of input.

The delayed amount 931 is, for example, about 2.3 µs. The delayed amount 932 is, for example, about 125 µs. Accordingly, the condition requiring that the interruption detection time from an interruption of optical signal input to detection of optical signal input interruption must be 2.3 µs or greater and the condition requiring that the recovery detection time from recovery of optical signal input to detection of optical signal input recovery must be 125 µs or greater, which are defined in SONET, can be satisfied.

According to the optical receiver 500 of an embodiment, by providing the buffer amplifier 510 at a stage prior to the detection unit 140, the operation of the time-constant circuit 160 or the detection unit 140 is prevented from being affected by the operation of the time-constant circuit 150 or the reception unit 130. Therefore, according to the optical receiver 500 of an embodiment, the main amplifier 131 can operate in a more stable manner.

In the offset circuit 170, changing the voltage level of the voltage regulator 630 can compensate for deviation of the non-inverted signal and the inverted signal with respect to the threshold, which has been caused by ASE included in the optical signal received by the optical receiver 500. Therefore, according to the optical receiver 500 of an embodiment, the BER when demodulating the electrical signals amplified by the main amplifier 131 can be optimized.

In the delay circuit 180, by connecting the resistor 182 in parallel to the diode 183, which constitute the time-constant circuit 187, the time constant of the time-constant circuit 187 can be changed in both cases of an interruption of optical signal input and a recovery from the interruption of optical signal input. Therefore, according to the optical receiver 500 of an embodiment, the conditions concerning the interruption detection time and the recovery detection time, which are defined in SONET, for example, can be satisfied.

Figure 10:
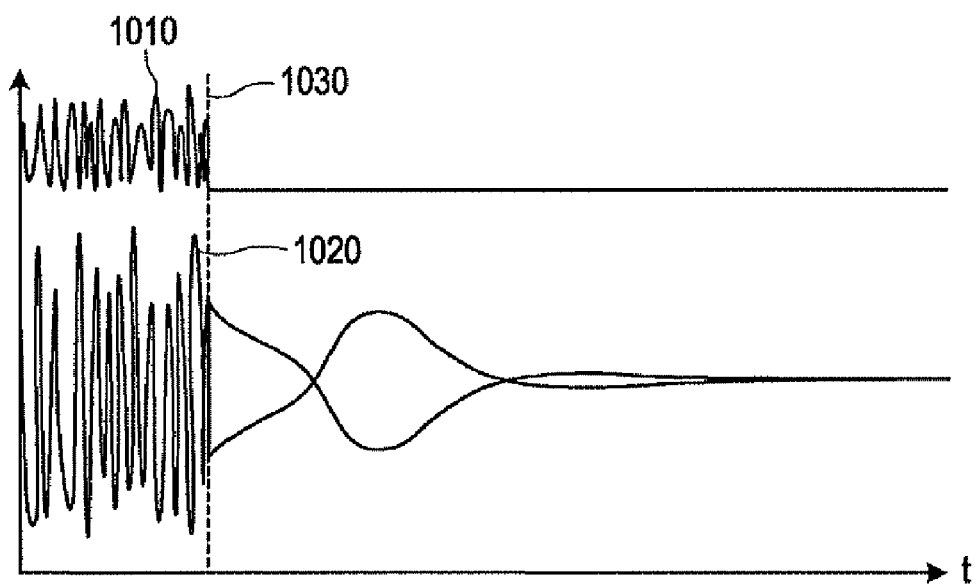
FIG. 10 is a waveform diagram showing exemplary electrical signals output to a reception unit.

FIG. 10 is a waveform diagram showing exemplary electrical signals output to the reception unit. Referring to FIG. 10, time axis is plotted in abscissa. 1010 denotes an optical signal received by the optical receiver 500. 1020 denotes electrical signals output from the splitter 120 to the reception unit 130. 1030 denotes an interruption of input of the optical signal 1010. As shown in FIG. 10, even in the case where the interruption of input of the optical signal 1010 occurs, since the time constant of the reception unit 130 is large, the electrical signals 1020 transiently vibrate due to a feedback loop and eventually converge.

Figure 11:
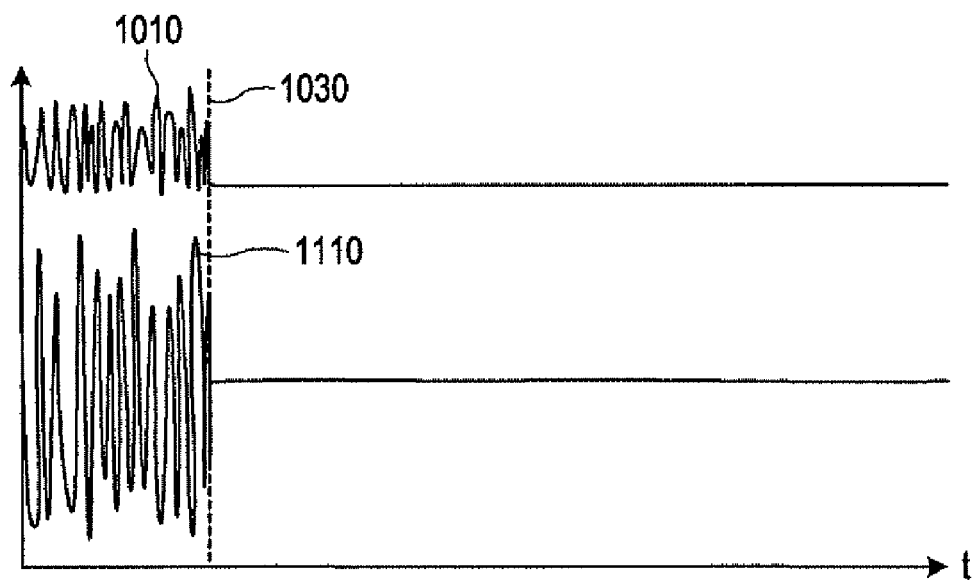
FIG. 11 is a waveform diagram showing exemplary electrical signals output to a detection unit.
Figure 12:
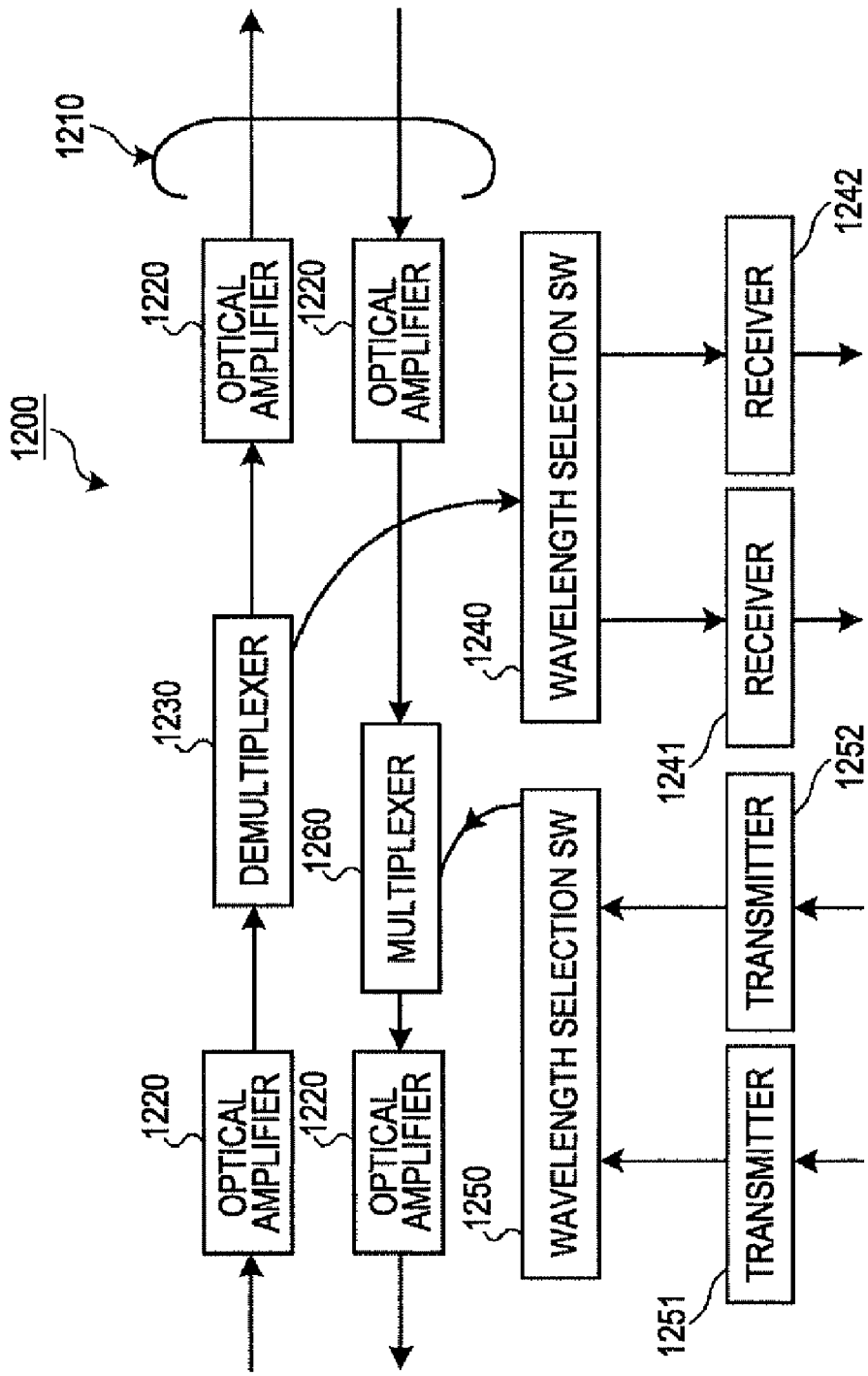
FIG. 12 is a block diagram showing the configuration of an optical communication system of the related art.
Figure 13:
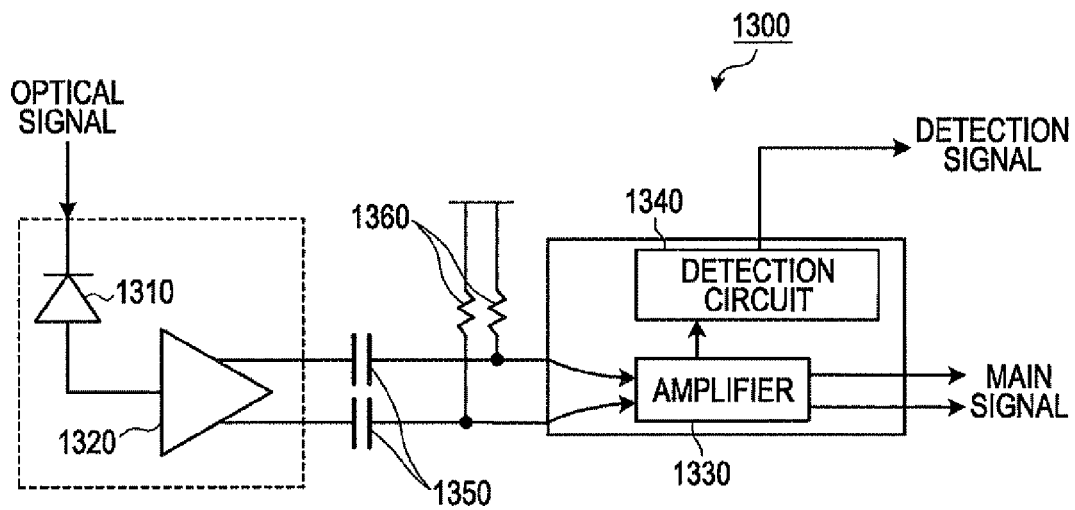
FIG. 13 is a block diagram showing the structure of an optical receiver of the related art.
Figure 14:
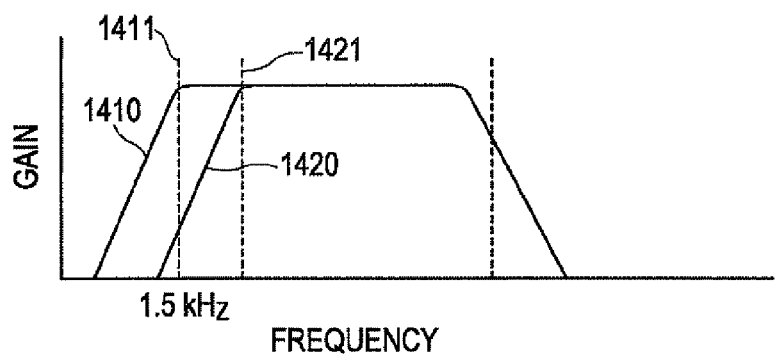
FIG. 14 illustrates band characteristics of the optical receiver of the related art.
Figure 15:
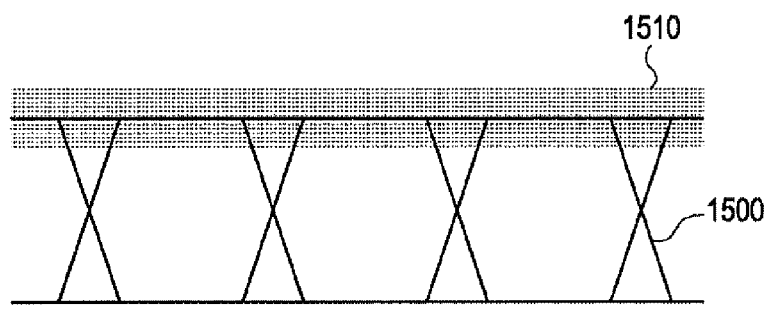
FIG. 15 illustrates an eye pattern of an optical signal received by the optical receiver of the related art.
Figure 16:
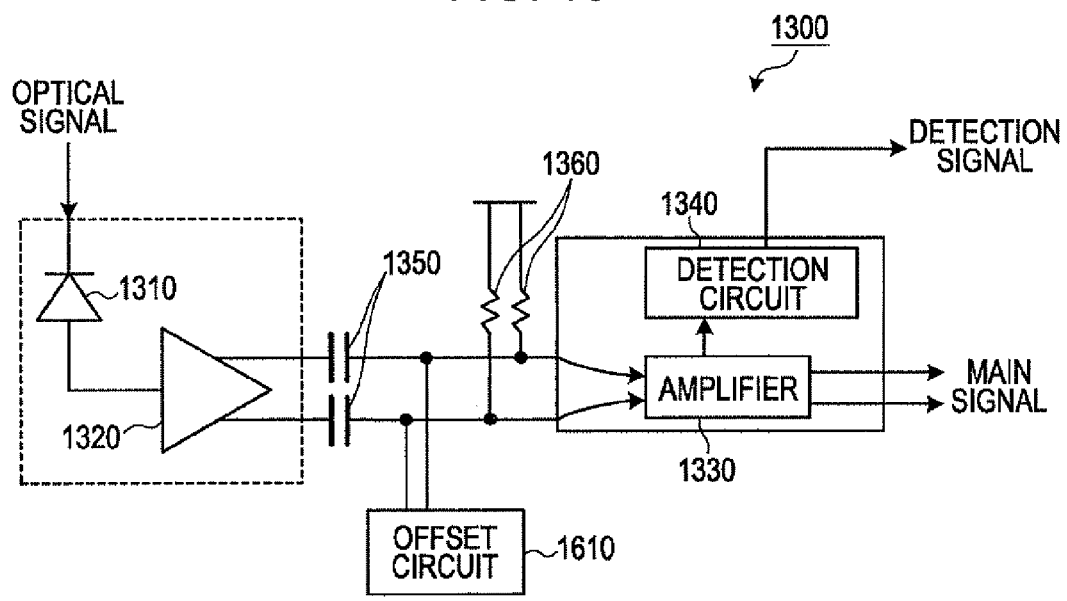
FIG. 16 is a block diagram showing a modification of the structure of the optical receiver of the related art.

FIG. 11 is a waveform diagram showing exemplary electrical signals output to the detection unit. In FIG. 11, portions similar to those shown in FIG. 10 are given the same reference numerals, and descriptions thereof are omitted. Referring to FIG. 11, 1110 denotes electrical signals output from the splitter 120 to the detection unit 140. As shown in FIG. 11, in the case where the input of the optical signal 1010 is interrupted, since the time constant of the detection unit 140 is small, the electrical signals 1110 instantaneously converge without transiently vibrating.

As has been described above, according to the optical receiver of the embodiments of the present invention, since each of the electrical signals is split by the splitter, while the sufficiently low cut-off frequency of the main amplifier is ensured, the time constant of the detection circuit can be reduced. Therefore, according to the optical receiver of the embodiments of the present invention, while broad frequency characteristics are maintained, input-interruption detecting characteristics are improved.

According to the optical receiver of the embodiments of the present invention, since broad frequency characteristics can be maintained, the BER is not increased even in the case of real-time changes in the format or the bit rate of optical signals in the system due to an optical switch or the like, and the characteristics can be maintained.

Although a few preferred embodiments of the present invention have been shown and described, it would be appreciated by those skilled in the art that changes may be made in these embodiments without departing from the principles and spirit of the invention, the scope of which is defined in the claim and their equivalents.

What is claimed is:

1. An optical receiver comprising:
    a photoelectric converting unit converting an input optical signal into a converted electrical signal;
    a splitting unit splitting the converted electrical signal into a plurality of split electrical signals;
    an amplifier amplifying one of the plurality of the split electrical signals with a first input time constant and thereby outputting an output signal;
    a detection circuit detecting an interruption of the input optical signal with a second input time constant on the basis of one of the plurality of the split electrical signals other than the one of the plurality of the split electrical signals input to the amplifier and thereby outputting a detection signal; and
    a delay circuit configured to delay the detection signal; wherein,
    the second input time constant of the detection circuit is smaller than the first input time constant of the amplifier.

2. The optical receiver according to claim 1, wherein the photoelectric converting unit includes,
    a photoelectric converting element converting an input optical signal to an electric signal, and
    a pre-amplifier amplifying the electric signal output from the converting element and thereby outputting the converted electric signal.

3. The optical receiver according to claim 1, further comprising:
    a first time-constant circuit disposed prior to the amplifier; and
    a second time-constant circuit disposed prior to the detection circuit; wherein,
    a time constant of the second time constant circuit is smaller than a time constant of the first time-constant circuit.

4. The optical receiver according to claim 3, further comprising an offset circuit adding an offset to the one of the plurality of the electrical signals inputting to the amplifier.

5. The optical receiver according to claim 4, wherein
at least one of the first time-constant circuit and the second time-constant circuit includes a capacitor, and,
the offset circuit and the detection circuit are separated from each other with the capacitor provided therebetween.

6. The optical receiver according to claim 1, wherein the delay circuit includes a resistor, a diode connected in parallel to the resistor, and a capacitor.

7. The optical receiver according to claim 1, further comprising a buffer amplifier disposed prior to the detection circuit.

8. The optical receiver according to claim 7, wherein the buffer amplifier includes an emitter-follower circuit.

9. The optical receiver according to claim 3, wherein the first time-constant circuit and the second time-constant circuit each include a coupling capacitor configured to cut off a direct current component and a terminating resistor configured to achieve impedance matching.

10. The optical receiver according to claim 1, wherein the optical receiver receives optical signals in a plurality of formats.

11. The optical receiver according to claim 1, wherein the optical receiver receives optical signals at a plurality of bit rates.

12. The optical receiver according to claim 3, wherein the time constant of the first time-constant circuit is a time constant in accordance with an optical signal at a lowest bit rate among a plurality of bit rates.

13. The optical receiver according to claim 1, wherein the optical signal is a non-return-to-zero signal, and the first amplifier is a differential amplifier.

14. An optical receiver comprising:
an optical detector converting an input optical signal into an input electrical signal;
an amplifier amplifying a part of the electrical signal with a first input time constant and thereby outputting an output electrical signal;
a interruption detector detecting an interruption of the input optical signal with a second input time constant based on a part of the electrical signal different from the part of the electrical signal the amplifier amplifies and thereby outputting an interruption detection signal; and
a delay circuit delaying the interruption detection signal output from the interruption detector by a delay time; wherein,
the second input time constant of the interruption detector is configured to satisfy an interruption detection requirement of the input optical signal,
the first input time constant of the amplifier is configured to satisfy a frequency characteristics requirement of the input optical signal, and
the delay time is shorter than a time that the interruption detection requirement sets so that an instantaneous interruption and an interruption fulfilling the interruption detection requirement are distinguished by the interruption detection signal and the output signal.

15. An optical receiver according to claim 14, wherein,
the second input time constant of the interruption detector is smaller than the input time constant of the amplifier, and,
the delay time is smaller than the second input time constant of the interruption detector.

16. A method comprising:
converting input optical signal to an electric signal;
amplifying a part of the electric signal with a first input time constant and thereby outputting an output signal;
detecting an interruption of the input optical signal with a second input time constant based on a part of the electric signal different from the part of the electric signal amplified and outputting an interruption detection signal; and
delaying the interruption detection signal by a delay time; wherein,
the first input time constant of said amplifying is configured to relate to the bit rate of the input optical signal,
the second input time constant of the interruption detecting is configured to relate to the format of the input optical signal,
the delay time is configured to enable distinction between an interruption of the input signal under a requirement of the format of the input optical signal and an instantaneous interruption, based on the interruption detection signal and the output signal.

* * * * *